(12) United States Patent
Chen et al.

(10) Patent No.: US 12,466,330 B2
(45) Date of Patent: Nov. 11, 2025

(54) MOUNTING STRUCTURE FOR MOUNTING AN ELECTRONIC DEVICE

(71) Applicant: Harman International Industries, Incorporated, Stamford, CT (US)

(72) Inventors: Jianing Chen, Northville, MI (US); David Jia, Canton, MI (US); Fan Wu, Shanghai (CN)

(73) Assignee: Harman International Industries, Incorporated, Stamford, CT (US)

( * ) Notice: Subject to any disclaimer, the term of this patent is extended or adjusted under 35 U.S.C. 154(b) by 206 days.

(21) Appl. No.: 17/993,272

(22) Filed: Nov. 23, 2022

(65) Prior Publication Data

US 2024/0166142 A1 May 23, 2024

(51) Int. Cl.
*H05K 7/20* (2006.01)
*B60R 11/02* (2006.01)
*B60R 11/00* (2006.01)

(52) U.S. Cl.
CPC ........ *B60R 11/0217* (2013.01); *H05K 7/2039* (2013.01); *B60R 2011/0042* (2013.01)

(58) Field of Classification Search
CPC .......................... H05K 7/2039; H05K 1/0203
See application file for complete search history.

(56) References Cited

U.S. PATENT DOCUMENTS

| | | | | |
|---|---|---|---|---|
| 6,241,007 | B1 * | 6/2001 | Kitahara | G06F 1/203 |
| | | | | 361/689 |
| 6,942,025 | B2 * | 9/2005 | Nair | H01L 23/467 |
| | | | | 174/16.3 |
| 9,277,681 | B2 * | 3/2016 | Kawai | H05K 7/20854 |
| 2019/0346126 | A1 * | 11/2019 | Wada | H01L 23/367 |

FOREIGN PATENT DOCUMENTS

JP      2009164409 A * 7/2009 ............. H01L 23/12

OTHER PUBLICATIONS

JP 2009164409 A, English translation (Year: 2009).*

* cited by examiner

*Primary Examiner* — Mukundbhai G Patel
(74) *Attorney, Agent, or Firm* — Burris Law, PLLC

(57) ABSTRACT

A mounting structure includes base wall formed of a thermally conductive material and configured to provide a thermally conductive pathway between an electronic device mounted to an inner side of the base wall and a panel in contact with an outer side of the base wall that is opposite the inner side. The outer side includes a plurality of bumps configured to engage the panel. The base wall includes a plurality of tabs. Each tab configured to receive a corresponding fastener to secure the base wall to the panel.

20 Claims, 6 Drawing Sheets

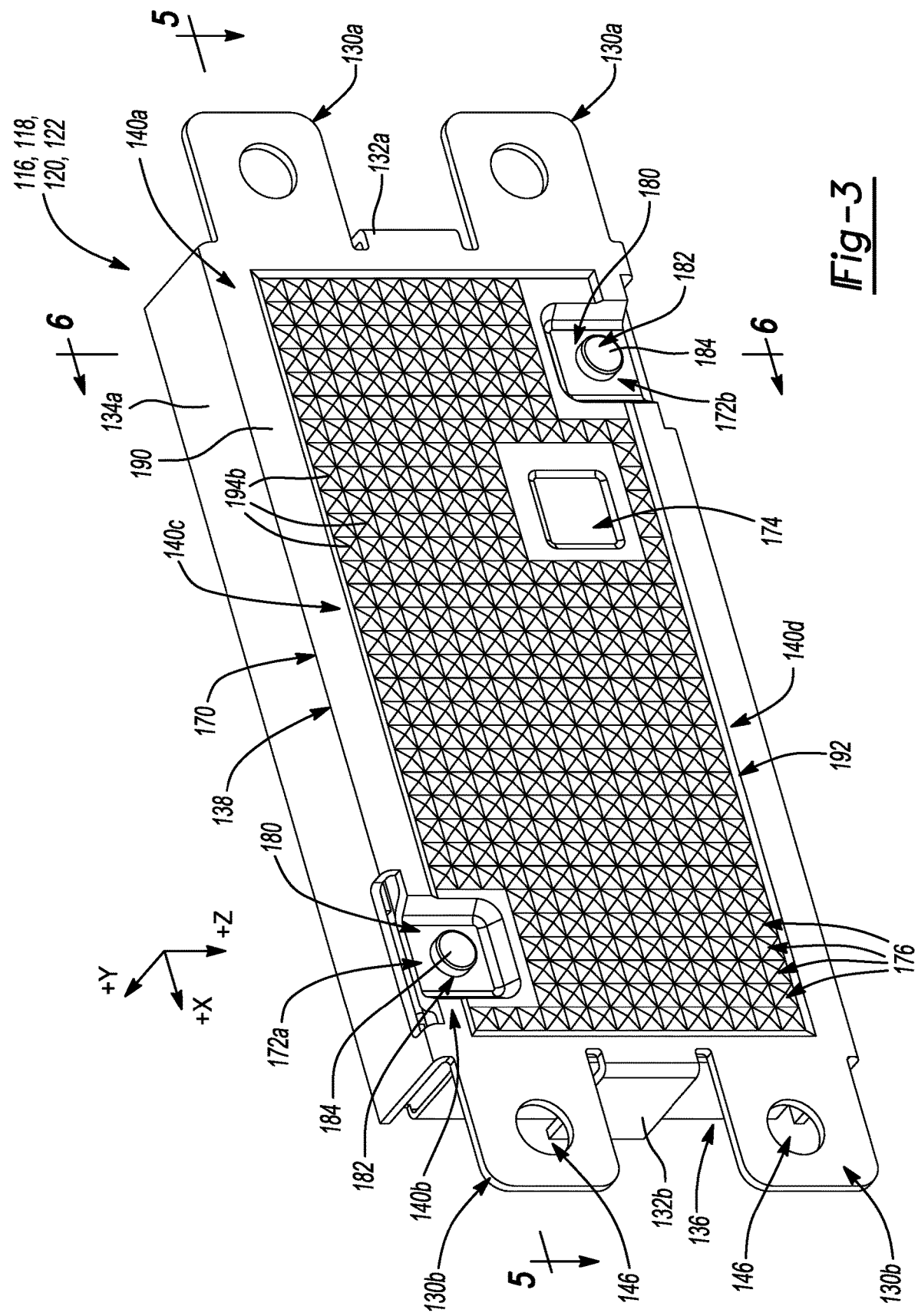

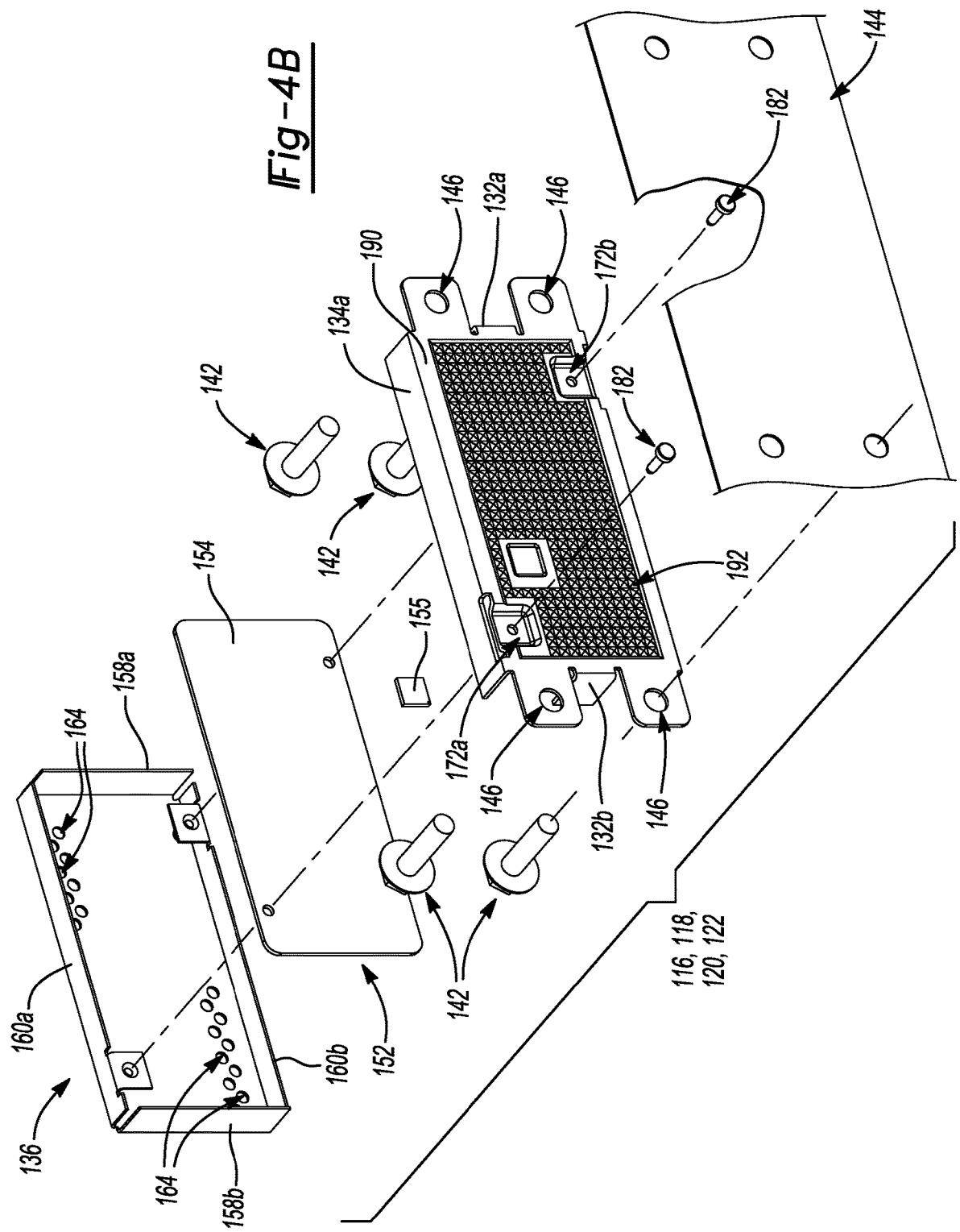

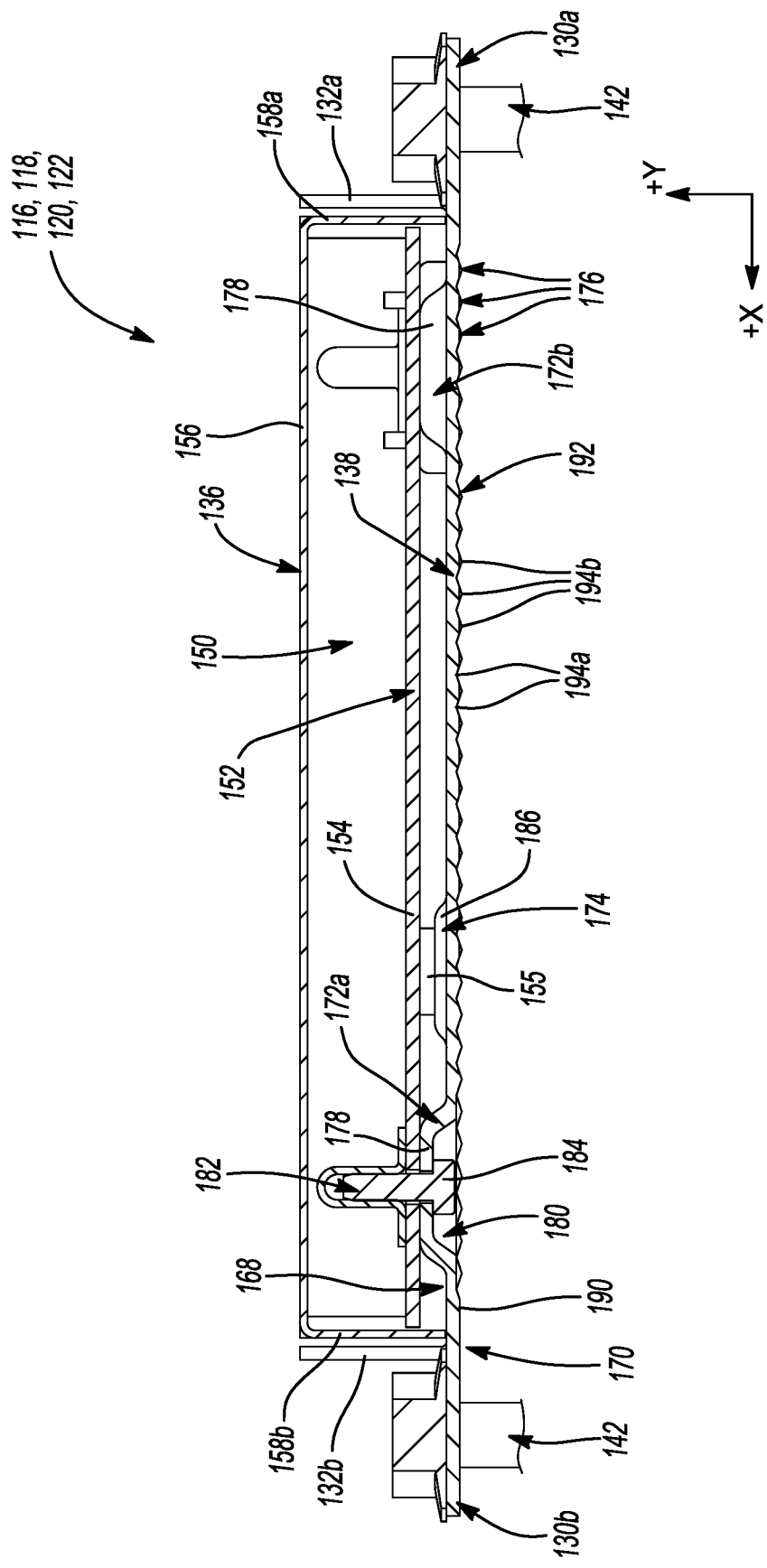

MOUNTING STRUCTURE FOR MOUNTING AN ELECTRONIC DEVICE

FIELD

The present disclosure relates to a mounting structure for mounting an electronic device.

BACKGROUND

The statements in this section merely provide background information related to the present disclosure and may not constitute prior art.

Conventional vehicles include electronic devices that may operate one or more vehicle systems such as an audio system of the vehicle. Such electronic devices may be supported by a mounting structure, which, in turn, is mounted to a body of the vehicle. Thus, heat generated by the electronic device may be transferred to the body of the vehicle by the mounting structure. However, poor thermal contact between the mounting structure and the body of the vehicle may inhibit a thermally conductive pathway between the electronic device and the body of the vehicle.

These issues with thermal contact between the mounting structure and the vehicle body, among other issues with thermally conductive pathways, are addressed by the present disclosure.

SUMMARY

This section provides a general summary of the disclosure and is not a comprehensive disclosure of its full scope or all of its features.

In one form, the present disclosure provides a mounting structure that includes base wall formed of a thermally conductive material and configured to provide a thermally conductive pathway between an electronic device mounted to an inner side of the base wall and a panel in contact with an outer side of the base wall that is opposite the inner side. The outer side includes a plurality of bumps configured to engage the panel. The base wall includes a plurality of tabs. Each tab configured to receive a corresponding first fastener to secure the base wall to the panel.

In variations of the mounting structure of the above paragraph, which may be implemented individually or in any combination: the tabs extend from the base wall, each tab defining an aperture; each first fastener extends through an aperture of a respective tab and is configured to extend through the panel to secure the base wall to the panel; the outer side of the base wall includes a smooth outer surface facing an outward direction that is toward the panel, the bumps extend in the outward direction beyond the outer surface; the electronic device is mounted to the inner side of the base wall; a cover cooperates with the base wall to define a cavity that houses electrical components of the electronic device; the base wall includes a plurality of mount portions that define protrusions extending into the cavity on the inner side of the base wall and define recesses on the outer side of the base wall; a plurality of second fasteners, each second fastener extends through the cover and a respective mount portion of the base wall to secure the cover to the base wall; each second fastener includes a head received in the corresponding recess to be spaced apart from the panel; the base wall includes at least one contact portion that defines a protrusion extending into the cavity and configured to be in thermal contact with an electrical component of the electronic device; each bump of the plurality of bumps has a pyramid shape; each bump of the plurality of bumps has a proximal portion and a distal portion, the proximal portion extends from a surrounding portion of the base wall and surrounds the distal portion, the distal portion is pointed and configured to contact the panel; and a plurality of side walls extending perpendicular from the base wall in a direction away from the panel.

In another form, the present disclosure provides a mounting structure that includes a base wall formed of a thermally conductive material and configured to provide a thermally conductive pathway between an electronic device mounted to an inner side of the base wall and a panel in contact with an outer side of the base wall that is opposite the inner side. The inner side includes an inner surface that faces in a first direction toward the electronic device. The outer side includes an outer surface and a textured region. The outer surface faces in a second direction that is opposite the first direction. The textured region includes a plurality of bumps. Each bump having a proximal portion and a distal portion. The proximal portion being recessed in the first direction relative to the outer surface and the distal portion being raised in the second direction relative to the outer surface.

In variations of the mounting structure of the above paragraph, which may be implemented individually or in any combination: a plurality of tabs extend from the base wall; a plurality of fasteners extend through respective tabs of the plurality of tabs and are configured to extend into the panel to secure the base wall to the panel; the textured portion is at least partially surrounded by the outer surface; a cover cooperates with the base wall to define a cavity that houses electrical components of the electronic device; the base wall includes a plurality of protrusions extending into the cavity and configured to contact the electrical components; and each fastener extends through the cover and a respective protrusion to secure the cover to the base wall, a head of each fastener is received in a corresponding recess that is recessed in the first direction from the outer surface.

In yet another form, the present disclosure provides a mounting structure that includes an electronic device, a base wall, a cover, and first fasteners. The base wall is base wall formed of a thermally conductive material and provides a thermally conductive pathway between the electronic device mounted to an inner side of the base wall and a panel in contact with an outer side of the base wall that is opposite the inner side. The inner side includes an inner surface that faces in a first direction toward the electronic device. The outer side includes an outer surface and a textured region. The outer surface faces in a second direction that is opposite the first direction. The textured region includes a plurality of bumps. Each bump has a proximal portion and a pointed distal portion. The proximal portion being recessed in the first direction relative to the outer surface and the pointed distal portion extending in the second direction beyond the outer surface. The cover cooperates with the base wall to define a cavity that houses the electronic device. Each first fastener extends through the cover and the base wall to secure the cover to the base wall. The base wall further includes a plurality of protrusions and a plurality of tabs. The protrusions extend in the first direction into the cavity and contact the electronic device. Each first fastener extends through the cover and a respective protrusion of the base wall. Each tab is configured to receive a corresponding second fastener to secure the base wall to the panel.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 3 is a perspective view of one mounting structure of FIG. 1;

FIG. 4B is another exploded view of one mounting structure of FIG. 1;

Figure 6:
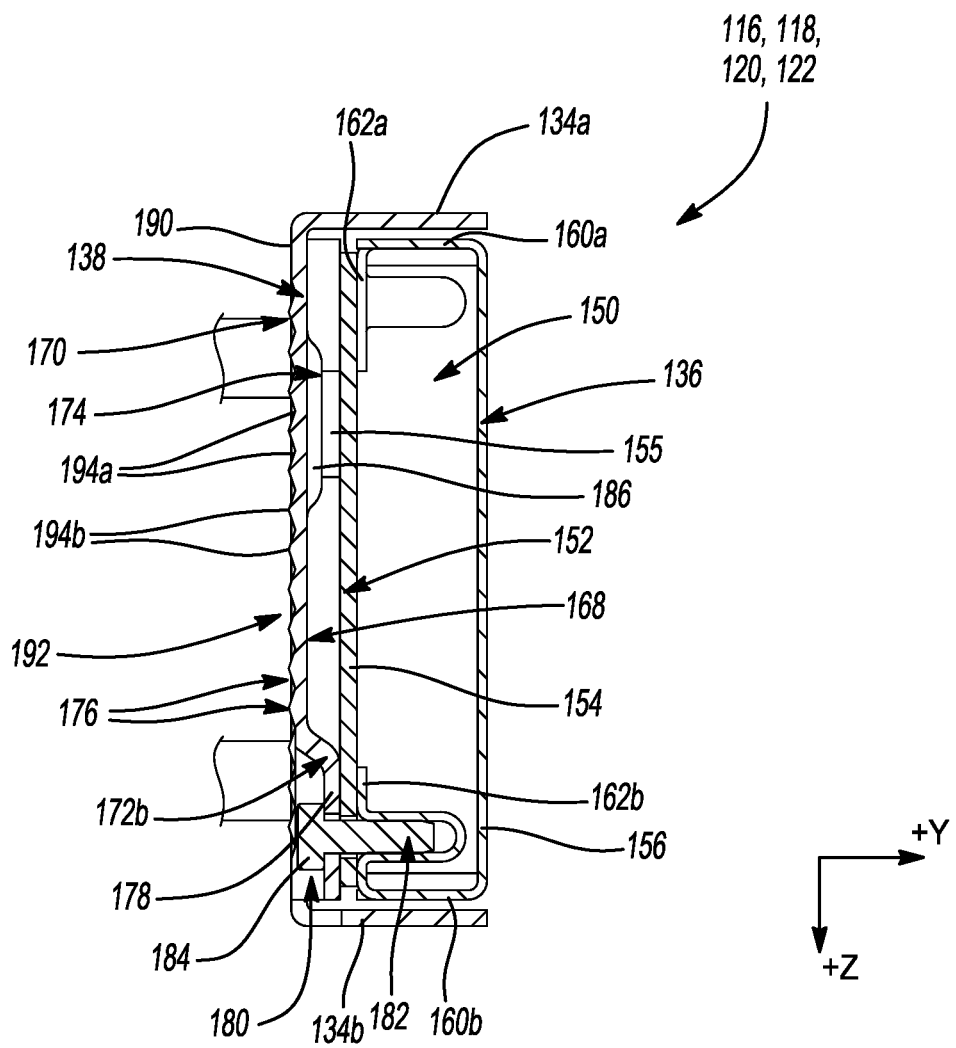

FIG. 5. is a cross-sectional view of the mounting structure taken along line 5-5 of FIG. 3; and FIG. 6 is another cross-sectional view of the mounting structure taken along line 6-6 of FIG. 3.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure relates to mounting structures that include bump features providing thermal contact with a panel of a vehicle. In this way, a thermally conductive pathway is provided between the electronic device secured to the mounting structure and the panel of the vehicle when the mounting structures are mounted to the vehicle, which allows heat generated by the electronic device to flow to the panel, thereby cooling the electronic device.

Figure 1:
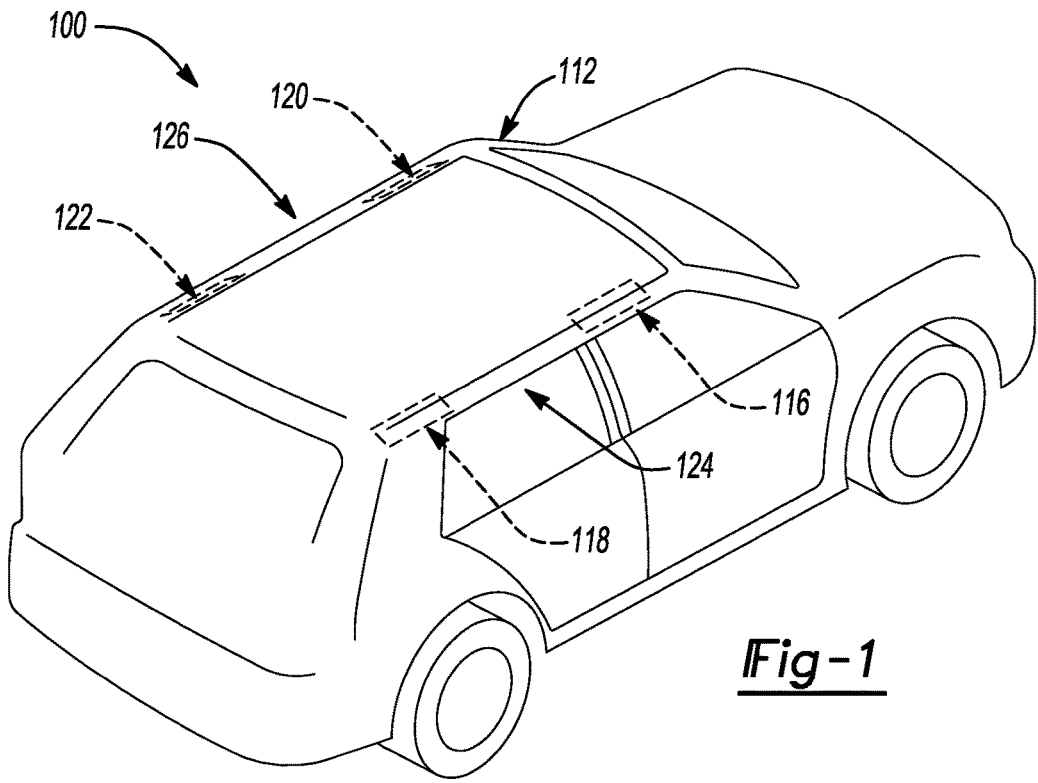
FIG. 1 is a perspective view of a vehicle having mounting structures according to the principles of the present disclosure.

With reference to FIG. 1, a vehicle 100 is illustrated. The vehicle 100 includes a vehicle body structure 112 and one or more mounting structure. In the specific example illustrated, a plurality of mounting structures are included and identified by reference numerals 116, 118, 120, and 122, though fewer or more mounting structures can be used. In the example illustrated, the vehicle body structure 112 is the main supporting structure of the vehicle 110, to which various components are attached either directly or indirectly. The vehicle body structure 112 includes a plurality of vertical body-mounted pillars (e.g., front, middle, and rear pillars), roof side rails 124, 126, and sills. The front and middle vertical body-mounted pillars, the sills and the roof side rails 124, 126 cooperate to define front door openings in the vehicle body structure 112. The middle and rear vertical body-mounted pillars, the sills, and the roof side rails 124, 126 cooperate to define rear door openings in the vehicle body structure 112. In the example illustrated, the vehicle body structure 112 may be a unibody vehicle architecture, though other configurations can be used, such as a body on frame vehicle architecture for example. In some forms, the vehicle 100 may be an electric vehicle such as a battery electric vehicle (BEV), a hybrid electric vehicle (HEV), a plug-in electric vehicle (PHEV), or a fuel cell vehicle, for example. In other forms, the vehicle 100 may be an internal combustion engine (ICE) vehicle.

The plurality of mounting structures 116, 118, 120, 122 are mounted to various locations of the vehicle body structure 112. In the example illustrated, the mounting structure 116 is mounted within the roof side rail 124 proximate the front pillar, the mounting structure 118 is mounted within the roof side rail 124 proximate the rear pillar, the mounting structure 120 is mounted within the roof side rail 126 proximate the front pillar, and the mounting structure 122 is mounted within the roof side rail 126 proximate the rear pillar. It should be understood that the mounting structures 116, 118, 120, 122 may be mounted in other locations of the vehicle body structure 112 such as the vertical-body mounted pillars and/or roof headers (e.g., front and rear roof headers), for example. While described herein with reference to a vehicle, it should be understood that the mounting structure described herein can be used in non-vehicle applications, such as being mounted to a structure of a device that is not associated with a vehicle, for example.

Figure 2:
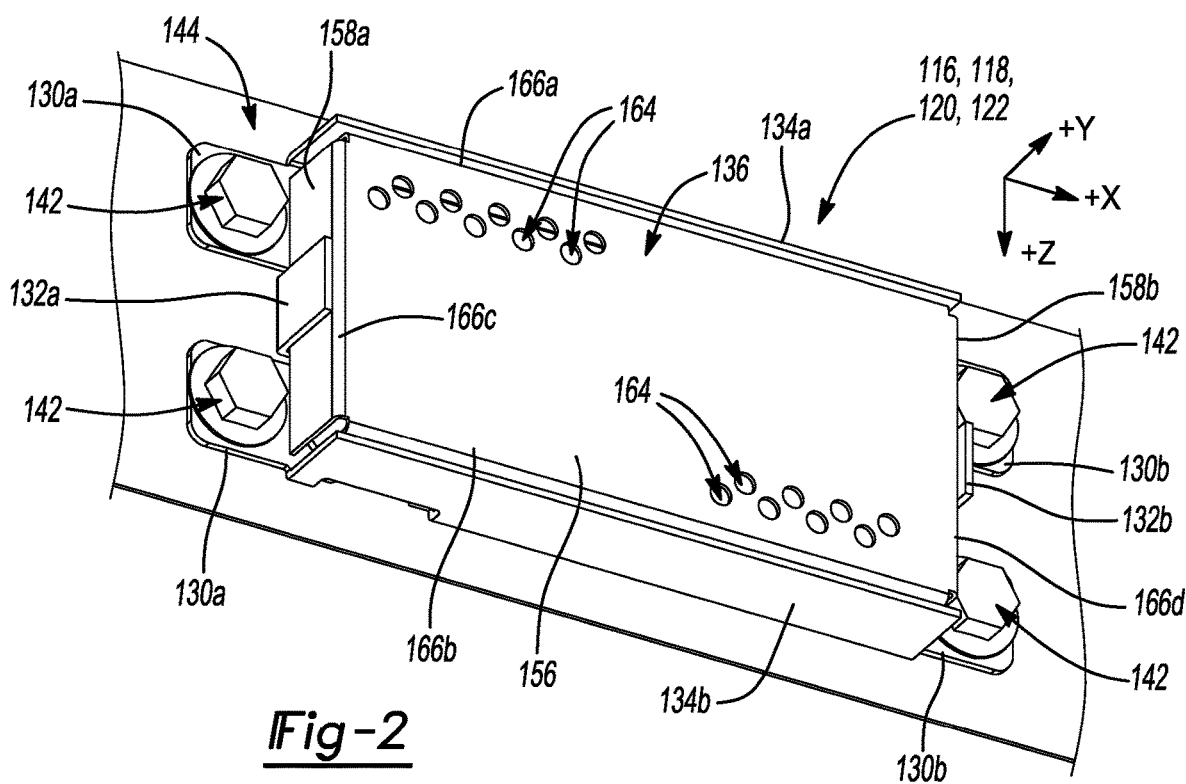
FIG. 2 is a perspective view of one mounting structure of FIG. 1 secured to a panel of the vehicle.
Figure 4A:
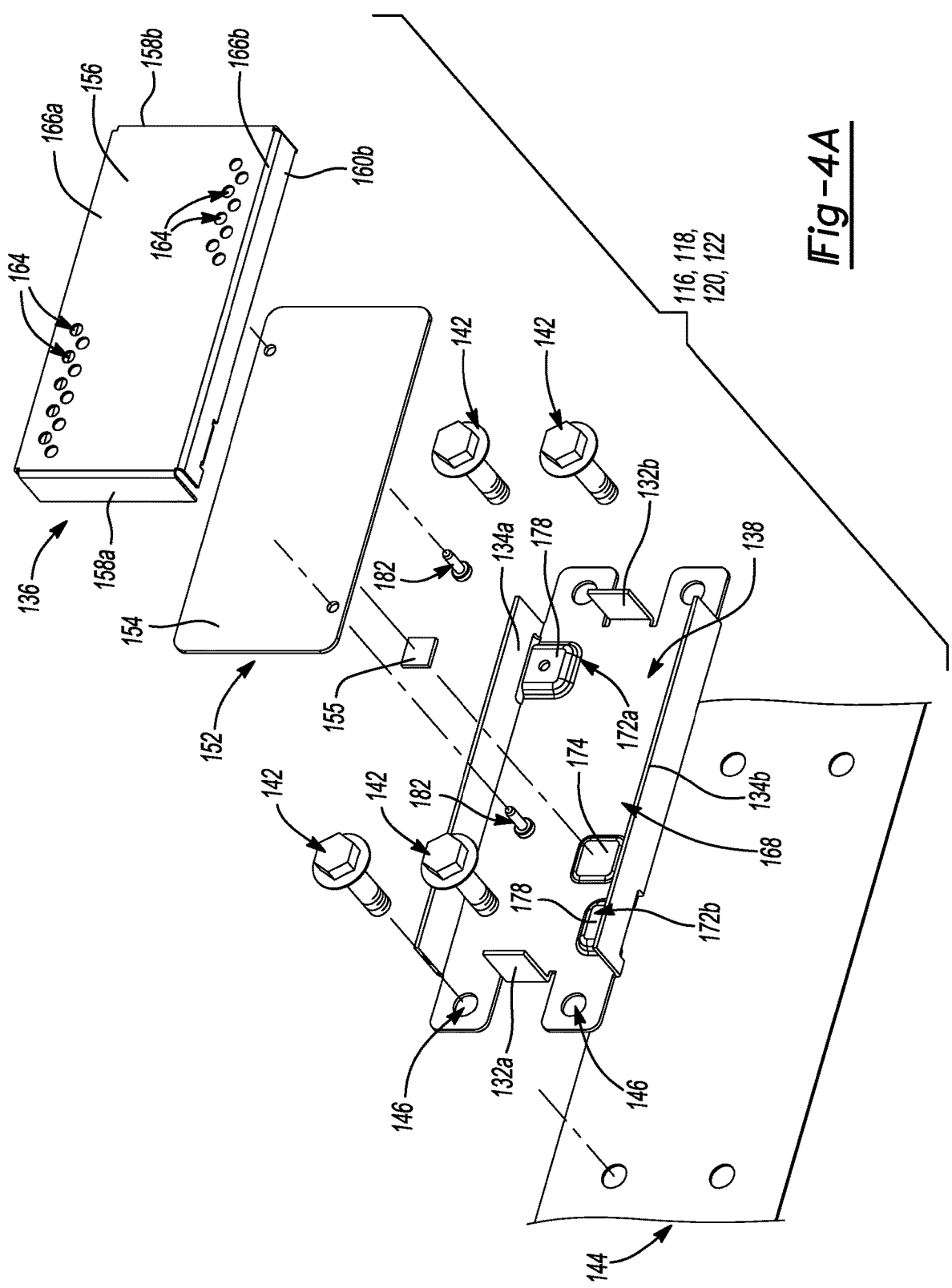
FIG. 4A is an exploded view of one mounting structure of FIG. 1.

With reference to FIGS. 2, 3, 4A, and 4B, each mounting structure 116, 118, 120, 122 includes a plurality of tabs 130a, 130b, a cover 136, and a base wall 138. Each mounting structure 116, 118, 120, 122 may optionally also include a pair of first side walls 132a, 132b, a pair of second side walls 134a, 134b. The tabs 130a extend from an end 140a of the base wall 138 (FIG. 3) and the tabs 130b extend from an end 140b of the base wall 138 (FIG. 3) that is opposite the end 140a. In the example illustrated, the tabs 130a are spaced apart from each other and the tabs 130b are spaced apart from each other. Each tab 130a, 130b receives a corresponding fastener 142 that secures the base wall 138 to a panel 144 (FIGS. 2 and 4A). In the example provided, the panel 144 is a panel of a respective roof side rail 124, 126 (FIG. 1), though other configurations can be used.

As used herein, the term "fastener" should be construed to mean a structure or component that secures the base wall 138 to the panel 144 by applying a force to one or both of the base wall 138 and panel 144 causing one or both of the base wall 138 and panel 144 to move toward each other. In the example illustrated, each tab 130a, 130b defines an aperture 146 (FIGS. 3, 4A, and 4B) that receives the fastener 142 taking the form of a threaded screw or threaded bolt, for example. In this way, the fastener 142 extends through the aperture 146 of a respective tab 130a, 130b and at least partially through the panel 144, thereby securing the base wall 138 and the panel 144 to each other. In some embodiments where the fastener 142 is a screw, the panel 144 may be threaded to threadably engage the fastener 142. In some embodiments where the fastener 142 is a bolt, the fastener 142 may threadably engage a threaded component, such as a nut (not shown), disposed on an opposite side of the panel 144. In some embodiments, the fastener 142 may take the form of a clamp, for example, that is connected to a respective tab 130a, 130b and the panel 144, thereby securing the base wall 138 and the panel 144 to each other by applying a force to both the base wall 138 and the panel 144 causing both the base wall 138 and the panel 144 to move toward and engage each other.

The pair of first side walls 132a, 132b extend perpendicular from the base wall 138 in a +Y direction away from the panel 144. That is, the first side wall 132a is located between two of the tabs 130a and extends perpendicular from the end 140a (FIG. 3) of the base wall 138 in the +Y direction away from the panel 144. The first side wall 132a inhibits movement of the cover 136 in a −X direction. In the example illustrated, the first side wall 132a is spaced apart from the tabs 130a. In some forms, the first side wall 132a may engage the tabs 130a. The first side wall 132b is located between two of the tabs 130b and extends perpendicular from the end 140b (FIG. 3) of the base wall 138 in the +Y direction away from the panel 144. The first side wall 132b inhibits movement of the cover 136 in a +X direction. In the example illustrated, the first side wall 132b is spaced apart from the tabs 130b. In some forms, the first side wall 132b may engage the tabs 130b.

The pair of second side walls 134a, 134b extend perpendicular from the base wall 138 in the +Y direction away from the panel 144 (i.e., the pair of second side walls 134a, 134b extend in the same direction that the pair of first side walls 132a, 132b extend). That is, the second side wall 134a extends perpendicular from end 140c (FIG. 3) of the base wall 138 in the +Y direction away from the panel 144. The second side wall 134a extends along substantially an entire length of the end 140c and inhibits movement of the cover 136 in a −Z direction. The second side wall 134b extends perpendicular from end 140d (FIG. 3) of the base wall 138 in the +Y direction away from the panel 144. The end 140d of the base wall 138 is opposite the end 140c of the base wall 138. The second side wall 134b extends along substantially an entire length of the end 140d and inhibits movement of the cover 136 in a +Z direction.

With additional reference to FIGS. 5 and 6, the cover 136 cooperates with the base wall 138 to define a cavity 150 that houses an electronic device 152 configured to operate one or more systems of the vehicle 10 such as an audio system of the vehicle 10. In one example, the electronic device 152 may include one or more electrical components 154 such as one or more printed circuit boards (PCBs) having one or more integrated circuits 155 attached thereto.

The cover 136 includes a base wall 156, a pair of first side walls 158a, 158b, a pair of second side walls 160a, 160b, and a plurality of tabs 162a, 162b (FIG. 6). The base wall 156 (FIGS. 2, 4A, 5, and 6) is spaced apart from the base wall 138 and may optionally include a plurality of apertures 164 (FIGS. 2 and 4A) extending therethrough. That is, one or more apertures 164 of the plurality of apertures 164 may extend through the base wall 156 proximate end 166a of the base wall 156, and one or more apertures 164 of the plurality of apertures 164 may extend through the base wall 156 proximate end 166b of the base wall 156 that is opposite end 166a. In some embodiments, the apertures 164 may extend through a center portion of the base wall 156 or any other area of the base wall 156.

With reference to FIGS. 2, 4A, 4B, and 5, the pair of first side walls 158a, 158b extend perpendicular from the base wall 156 in the −Y direction toward the panel 144 and may optionally engage the base wall 138. That is, the first side wall 158a is located proximate the first side wall 132a and extends perpendicular from end 166c of the base wall 156 in the −Y direction toward the panel 144. The first side wall 158a is also located closer toward the electronic device 152 than the first side wall 132a. In the example illustrated, the first side wall 158a is spaced apart from the electronic device 152 and the first side wall 132a (FIG. 5). The first side wall 158b is located proximate the first side wall 132b and extends perpendicular from end 166d of the base wall 156 in the −Y direction toward the panel 144. The end 166d of the base wall 156 is opposite the end 166c of the base wall 156. The first side wall 158b is also located closer toward the electronic device 152 than the first side wall 132b. In the example illustrated, the first side wall 158b is spaced apart from the electronic device 152 and the first side wall 132b.

With reference to FIGS. 4A, 4B, and 6, the pair of second side walls 160a, 160b extend perpendicular from the base wall 156 in the −Y direction toward the panel 144 and may optionally be spaced apart from the base wall 138 (i.e., the pair of second side walls 160a, 160b extend in the same direction that the pair of first side walls 158a, 158b extend). That is, the second side wall 160a is located proximate the second side wall 134a and extends perpendicular from the end 166a of the base wall 156 in the −Y direction toward the panel 144. The second side wall 160a is also located closer toward the electronic device 152 than the second side wall 134a. The second side wall 160b is located proximate the second side wall 134b and extends perpendicular from the end 166b of the base wall 156 in the −Y direction toward the panel 144. The second side wall 160b is also located closer toward the electronic device 152 than the second side wall 134b.

One or more tabs 162a (FIG. 6) extend from an end of the second side wall 160a into the cavity 150 and engage the electrical component 154 of the electronic device 152. Similarly, one or more tabs 162b (FIG. 6) extend from an end of the second side wall 160b into the cavity 150 and engage the electrical component 154 of the electronic device 152. In some embodiments, one or more tabs (not shown) may extend from the first side walls 158a, 158b into the cavity 150 and engage the electronical component 154.

The base wall 138 is formed of a thermally conductive material and is configured to provide a thermally conductive pathway between the electronic device 152 mounted to an inner side 168 of the base wall 138 and the panel 144 of a respective roof side rail 124, 126 in contact with an outer side 170 of the base wall 138 that is opposite the inner side 168. In one example, the base wall 138 may be made of a metal material such as aluminum, for example. The base wall 138 supports the electronic device 152 and includes a plurality of mount portions 172a, 172b, at least one contact portion 174, and a plurality of bumps or bump features 176.

With reference to FIGS. 3, 4A, 4B, 5, and 6, the plurality of mount portions 172a, 172b are located at various locations along the base wall 138. In the example illustrated, the mount portion 172a is located proximate end 140c of the base wall 138 and the mount portion 172b is located proximate end 140d of the base wall 138. In some embodiments, mount portions 172a, 172b may be located in a center area of the base wall 138 or at any other area of the base wall 138. The plurality of mount portions 172a, 172b define protrusions 178 extending into the cavity 150 on the inner side 168 of the base wall 138 and define recesses 180 on the outer side 170 of the base wall 138. Each protrusion 178 contacts the electrical component 154 (FIGS. 5 and 6) of the electronic device 152. In this way, a fastener 182 (FIGS. 5 and 6) extends through a respective tab 162a, 162b of the cover 136 and a respective protrusion 178 to secure the cover 136 and electrical component 154 to the base wall 138. Each fastener 182 includes a head 184 (FIGS. 3, 5, and 6) that is received in a corresponding recess 180 such that the head 184 may be spaced apart from the panel 144.

In the example illustrated, the contact portion 174 is located proximate end 140d of the base wall 138 and contacts the electrical component 154 of the electronic device 152. That is, the contact portion 174 defines a protrusion 186 extending into the cavity 150 on the inner side 168 of the base wall 138 that is in thermal contact with the electrical component 154. For example, the protrusion 186 may be in thermal contact with one or more integrated circuit (IC) 155, for example, that may be attached to the PCB.

The inner side 168 includes an inner surface that faces in the +Y direction toward the electronic device 152. As shown in FIGS. 3, 5, and 6, the outer side 170 includes an outer surface 190 and a textured region 192. In the example illustrated, the outer surface 190 is smooth and faces in the −Y direction. The outer surface 190 also surrounds the textured region 192. In some embodiments, the textured region 192 may surround the outer surface 190. The textured region 192 forms substantially an entire area of the outer side 170 and includes the bump features 176.

In the example illustrated, the bump features 176 cooperate with each other to form a plurality of columns and rows at the outer side 170 of the base wall 138. In some embodiments, the bump features 176 may form another predetermined shape or pattern at the outer side 170 of the base wall 138 to facilitate heat transfer from the electronic device 152 to the panel 144. The bump features 176 are configured to engage the panel 144 when the base wall 138 is secured to the panel 144 by the fasteners 142. In this way, a thermally conductive pathway is formed between the electronic device 152 and the panel 144 and heat generated by the electronic device 152 may flow to the panel 144 by thermal conduction, thereby cooling the electronic device 152. That is, a first portion of the heat generated by one or more electrical components 154 of the electronic device 152 may flow to the protrusions 178 of the mount portions 172a, 172b, then may flow to the base wall 138, then may flow to the bump features 176, and finally flows to the panel 144. A second portion of the heat generated by one or more electrical components 154 of the electronic device 152 may flow to the protrusions 186 of the contact portions 174, then may flow to the base wall 138, then may flow to the bump features 176, and finally flows to the panel 144.

In the example illustrated, the bump features 176 extend outward in the −Y direction beyond the outer surface 190. Stated differently, the bump features 176 extend from the textured region 192 in the −Y direction beyond the outer surface 190. In the example provided, the bump features 176 also have a pyramid shape. In some embodiments, the bump features 176 may have a conical shape or any other suitable shape the tapers from a proximal portion toward a distal portion. Each bump feature 176 has a proximal portion 194a and a distal portion 194b. The proximal portion 194a extends from the base wall 138 may be recessed in the +Y direction relative to the outer surface 190. The proximal portion 194a extends from a surrounding portion of the base wall 138 and surrounds the distal portion 194b. The distal portion 194b is raised in the −Y direction relative to the outer surface 190 and is configured to contact the panel 144. In the example illustrated, the distal portion 194b has a pointed end. In this way, the distal portion 194b may be configured to deform against the panel 144 when the base wall 138 is secured to the panel 144 by the fasteners 142, thereby providing contact between each bump feature 176 and the panel 144. In some embodiments, the distal portion 194b may be configured to deform the panel 144 when the base wall 138 is secured to the panel 144 by the fasteners 142, thereby providing contact between each bump feature 176 and the panel 144. In some embodiments, the distal portion 194b may have an arcuate end, for example.

The mounting structures 116, 118, 120, 122 of the present disclosure include the bump features 176 to provide for thermal contact with the panel 144 of the vehicle 10. In this way, a thermally conductive pathway is provided between the electronic device 152 and the panel 144 when the mounting structures 116, 118, 120, 122 are mounted to the vehicle 10. It should be understood that the mounting structures 116, 118, 120, 122 of the present disclosure can be used in other applications involving providing a thermally conductive pathway between an electronic device and a panel of an object without departing from the scope herein.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A mounting structure comprising:
 a base wall formed of a thermally conductive material and configured to provide a thermally conductive pathway between an electronic device mounted to an inner side of the base wall and a panel in contact with an outer side of the base wall that is opposite the inner side, wherein the outer side includes an outer surface and a plurality of bumps configured to engage the panel such that the thermally conductive pathway is formed from the electronic device through the plurality of bumps to the panel, wherein the base wall includes a plurality of tabs, each tab configured to receive a corresponding first fastener to secure the base wall to the panel, wherein each bump includes a distal portion extending outwardly past the outer surface and configured to deform against the panel, wherein one or more second fasteners extend through a textured region of the base wall and are configured to extend through an electrical component to secure the electrical component to the base wall.

2. The mounting structure of claim 1, wherein the tabs extend from the base wall, each tab defining an aperture.

3. The mounting structure of claim 2, further comprising the first fasteners, each first fastener extending through an aperture of a respective tab and configured to extend through the panel to secure the base wall to the panel.

4. The mounting structure of claim 1, wherein the outer surface includes a smooth outer surface facing an outward direction that is toward the panel.

5. The mounting structure of claim 1, further comprising the electronic device mounted to the inner side of the base wall.

6. The mounting structure of claim 1, further comprising a cover cooperating with the base wall to define a cavity that houses electrical components of the electronic device.

7. The mounting structure of claim 6, wherein the base wall includes a plurality of mount portions that define protrusions extending into the cavity on the inner side of the base wall and define recesses on the outer side of the base wall.

8. The mounting structure of claim 7, further comprising a plurality of second fasteners, each second fastener extending through the cover and a respective mount portion of the base wall to secure the cover to the base wall.

9. The mounting structure of claim 8, wherein each second fastener includes a head received in a corresponding recess to be spaced apart from the panel.

10. The mounting structure of claim 6, wherein the base wall includes at least one contact portion that defines a protrusion extending into the cavity and configured to be in thermal contact with an electrical component of the electronic device.

11. The mounting structure of claim 1, wherein each bump of the plurality of bumps has a pyramid shape.

12. The mounting structure of claim 1, wherein each bump of the plurality of bumps has a proximal portion, the proximal portion extending from a surrounding portion of the base wall and surrounding the distal portion, and wherein the distal portion is pointed and configured to contact the panel.

13. The mounting structure of claim 1, further comprising a plurality of side walls extending perpendicular from the base wall in a direction away from the panel.

14. A mounting structure comprising:
a base wall formed of a thermally conductive material and configured to provide a thermally conductive pathway between an electronic device mounted to an inner side of the base wall and a panel in contact with an outer side of the base wall that is opposite the inner side, wherein the inner side includes an inner surface that faces in a first direction toward the electronic device, wherein the outer side includes an outer surface and a textured region, the outer surface facing in a second direction that is opposite the first direction, wherein the textured region includes a plurality of bumps, each bump having a proximal portion and a distal portion, the proximal portion being recessed in the first direction relative to the outer surface and the distal portion extending d in the second direction outwardly past the outer surface, wherein one or more fasteners extend through a textured region of the base wall and are configured to extend through an electrical component to secure the electrical component to the base wall, the one or more fasteners recessed in the first direction relative to the outer surface.

15. The mounting structure of claim 14, further comprising:
a plurality of tabs extending from the base wall; and
a plurality of fasteners extending through respective tabs of the plurality of tabs and configured to extend into the panel to secure the base wall to the panel.

16. The mounting structure of claim 14, wherein the textured region is at least partially surrounded by the outer surface.

17. The mounting structure of claim 14, further comprising a cover cooperating with the base wall to define a cavity that houses electrical components of the electronic device.

18. The mounting structure of claim 17, wherein the base wall includes a plurality of protrusions extending into the cavity and configured to contact the electrical components.

19. The mounting structure of claim 18, wherein the proximal portion of each bump surrounds the distal portion of each bump, and wherein the distal portion of each bump is pointed and configured to contact the panel.

20. A mounting structure comprising:
an electronic device;
a base wall formed of a thermally conductive material and providing a thermally conductive pathway between the electronic device mounted to an inner side of the base wall and a panel in contact with an outer side of the base wall that is opposite the inner side, the inner side includes an inner surface that faces in a first direction toward the electronic device, the outer side includes an outer surface and a textured region, the outer surface facing in a second direction that is opposite the first direction, the textured region forms substantially an entire area of the outer side and includes a plurality of bumps, each bump having a proximal portion and a pointed distal portion, the proximal portion being recessed in the first direction relative to the outer surface and the pointed distal portion extending in the second direction outwardly past the outer surface;
a cover cooperating with the base wall to define a cavity that houses the electronic device; and
a plurality of first fasteners, each first fastener extending through the cover and the base wall to secure the cover to the base wall,
wherein the base wall further includes a plurality of protrusions and a plurality of tabs, the protrusions extending in the first direction into the cavity and contacting the electronic device, each first fastener extending through the cover and a respective protrusion of the base wall, each tab configured to receive a corresponding second fastener to secure the base wall to the panel,
wherein one or more second fasteners extend through a textured region of the base wall and are configured to extend through the electronic device to secure the electronic device to the base wall, the one or more second fasteners recessed in the first direction relative to the outer surface.

* * * * *